United States Patent [19]
Takahashi et al.

[11] Patent Number: 5,469,131
[45] Date of Patent: Nov. 21, 1995

[54] HYBRID INTEGRATED CIRCUIT DEVICE

[75] Inventors: Ryoichi Takahashi; Katsumi Okawa; Yusuke Igarashi, all of Osaka, Japan

[73] Assignee: Sanyo Electric Co., Ltd., Osaka, Japan

[21] Appl. No.: 114,329

[22] Filed: Aug. 30, 1993

[30] Foreign Application Priority Data

| Aug. 28, 1992 | [JP] | Japan | 4-229960 |
| Sep. 17, 1992 | [JP] | Japan | 4-247913 |
| Sep. 22, 1992 | [JP] | Japan | 4-252899 |
| Sep. 28, 1992 | [JP] | Japan | 4-258374 |
| Sep. 28, 1992 | [JP] | Japan | 4-258376 |
| Sep. 28, 1992 | [JP] | Japan | 4-258379 |

[51] Int. Cl.⁶ ............................................. H01C 1/012
[52] U.S. Cl. .......................... 338/306; 338/195; 338/307; 338/323; 338/330; 338/333
[58] Field of Search .................... 338/306, 307, 338/308, 309, 322, 323, 325, 330, 314, 331, 333, 195

[56] References Cited

U.S. PATENT DOCUMENTS

| 4,196,411 | 4/1980 | Kaufman | 338/314 |
| 4,204,187 | 5/1980 | Kakuhashi et al. | 338/307 |
| 4,345,465 | 8/1982 | Gruner et al. | 73/204 |
| 4,756,756 | 7/1988 | Cassat | 338/314 X |
| 5,262,615 | 11/1993 | Hancock | 338/195 X |

*Primary Examiner*—Marvin M. Lateef
*Attorney, Agent, or Firm*—Vineet Kohli; Thomas R. Morrison

[57] ABSTRACT

A resistive body of a hybrid integrated circuit has a resistance pattern on a resin film. Bonding pads permit connection of current through the resistance pattern. The resistance pattern may form part of a detecting bridge for overcurrent detection. One embodiment of the invention uses a rectangular resistance pattern with an opening in the center to force current to flow on a perimeter path for minimizing maximum temperature. Another embodiment uses a serpentine resistance pattern. A face-down resistance patter reduces interference. A direct-connection bonding pad reduces the voltage generated in a parasitic capacitance to improve the resistance of the resin film to voltage breakdown.

18 Claims, 12 Drawing Sheets

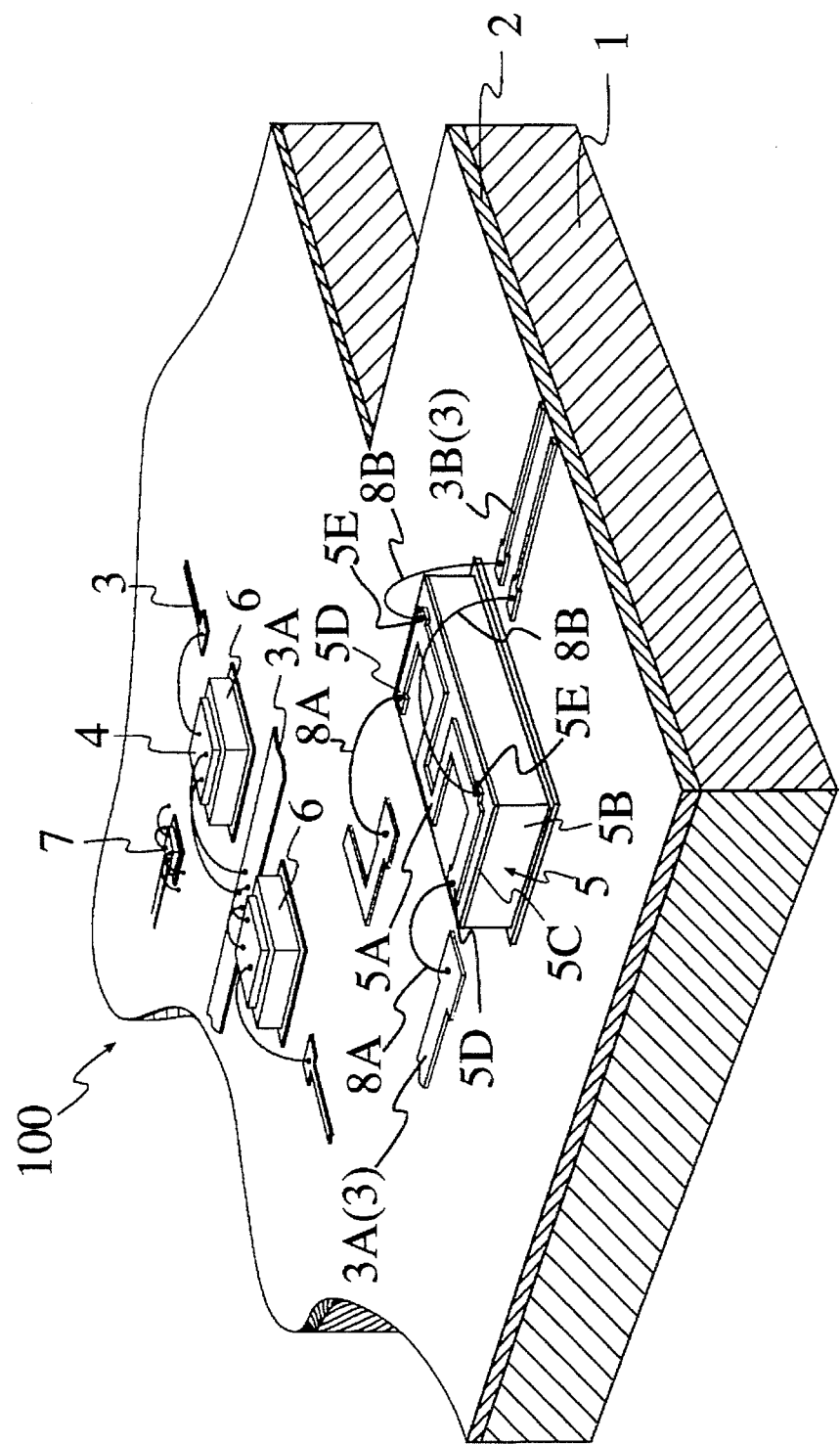

HYBRID INTEGRATED CIRCUIT DEVICE

BACKGROUND OF THE INVENTION

This invention relates to hybrid integrated circuit devices and, more specifically, to hybrid integrated circuit devices in which a resistive body made of an alloy material having a very low temperature coefficient of resistance (TCR) is connected to a surface of a substrate of the hybrid integrated circuit device by a plurality of bonding wires,.

A conventional means for detecting a current is the bridge circuit 20 shown in FIG. 3. A current $I_0$ 30 flows through a resistance $R_0$ 21 in one leg of bridge circuit 20. The remainder of this leg is made up of a resistor $R_3$. An opposite leg is made up of a resistor $R_1$ 22. A second pair of legs is made up of resistors $R_2$ 23 and $R_4$ 24. One terminal of a reference voltage source 35, represented by a breakdown, or Zener diode, is connected to the junction of resistors $R_1$ and $R_0$. The other terminal of reference voltage source 35 is connected to the junction of resistors $R_2$ and $R_4$. A plus input of a comparator 26 is connected to the junction of resistors $R_1$ and $R_2$. A minus input of comparator 26 is connected to the junction of resistors $R_3$ and $R_4$. The voltage at the minus input of comparator 26 is influenced by the current $I_0$ flowing through resistance $R_0$. At values of current $I_0$ below a predetermined trip value, the output of comparator 26 is low "L". As soon as the current $I_0$ exceeds the predetermined trip value, the output of comparator 26 changes suddenly to a high "H".

The predetermined trip voltage, or trip current, is established by the relationships of the resistances in bridge circuit 20. If the trip current is established at a maximum current in an external circuit, the "H" and "L" condition of the output of comparator 26 may be used to control the application of power, or some other condition of the external circuit, to avoid an overcurrent condition damaging the external circuit.

Japanese Laid-open Patent Publication No. 53-97470 illustrates the use of bridge circuit 20. Bridge circuit 20 is mounted on a substrate of a hybrid integrated circuit. The resistance $R_0$ to detect a current $I_0$ is normally a resistive body plated mainly with nickel (Ni). Since the fusing current in Ni plating is small, only currents smaller than the fusing current can be detected. Therefore, in order to detect larger currents, a greater fusing current is necessary. This can be accomplished by increasing the area or thickness of the resistive body. However, this larger area of the resistive body reduces the substrate area available to mount the bridge circuit 20. In addition, the plating time is further prolonged. So far, it has been impossible to detect currents in the range of 40 A with a hybrid integrated circuit.

Another way to detect larger currents is to use materials which have greater fusing currents. Copper foil or silver (Ag) paste have been used to solve the problem. Since the specific resistance of copper foil and Ag paste are respectively small, 0.5 m$\Omega$ and 37 m$\Omega$ per square cm, a larger current may be supplied to such a material. However, both materials present other problems. Ag paste is prepared by mixing epoxy resin with Ag powder. This results in an Ag paste having a large thermal resistance and a small electric power volume per unit area, therefore requiring an enlarged substrate area to increase the electric power volume. Copper foil has two problems. The first problem is that the substrate may be deformed as a result of the heat generated by a large current supplied to the copper foil. The second problem is that copper cannot attain a constant and stable resistance value. This is due to the imbalanced thickness of the copper foil from the rolling process or the side etching process. In addition, when using copper foil as a resistance element, it is difficult to trim the resistance, thus making it difficult to obtain an accurate detection of current.

In addition, the TCR of the copper foil and Ag paste are very high, 3800±200 ppm and 2150±150 ppm, respectively. Therefore, the resulting resistances are highly variable with respect to the temperature changes of the substrate. Resistance variations make it impossible to detect the current accurately. To solve this problem, a separate circuit for correcting for temperature variation is required, thus resulting in a more complex current detecting circuit.

SUMMARY AND OBJECTS OF THE INVENTION

Accordingly, it is an object of the present invention to overcome the drawbacks of the prior art.

It is still a further object of this invention to provide a hybrid integrated circuit device, in which the resistive body for detecting a current is a single unit, thereby making it easier to make a trimming adjustment of its resistance value and obtaining a more accurate current detection. It is still another object of this invention to provide a hybrid integrated circuit device, in which a resistive body for detecting a current is made of an alloy having a very low temperature coefficient of resistance, thereby enabling stable current detection.

It is still another object of this invention to provide a hybrid integrated circuit, in which a temperature generated in a resistive body for detecting a current can be dispersed so as to detect the current stably.

It is still another object of this invention to provide a hybrid integrated circuit, in which a resistive body for detecting a current eliminates problems caused by mutual inductance when detecting the current.

It is still another object of this invention to provide a hybrid integrated circuit, in which a resistive body for detecting a current has minimum thermal resistance and superior withstand voltage.

It is still another object of this invention to provide a hybrid integrated circuit, in which a resistive body for detecting a current has an adjustable resistance value so as to detect changes in a standard voltage.

It is still a further object of this invention to provide a hybrid integrated circuit, in which a resistive body for detecting a current is mounted facedown on a plurality of conductive paths.

Briefly stated, there is provided a resistive body of a hybrid integrated circuit having a resistance pattern on a resin film. Bonding pads permit connection of current through the resistance pattern. The resistance pattern may form part of a detecting bridge for overcurrent detection. One embodiment of the invention uses a rectangular resistance pattern with an opening in the center to force current to flow on a perimeter path for minimizing maximum temperature. Another embodiment uses a serpentine resistance pattern. A face-down resistance pattern reduces interference. A direct-connection bonding pad reduces the voltage generated in a parasitic capacitance to improve the resistance of the resin film to voltage breakdown.

According to an embodiment of the present invention, a hybrid integrated circuit device comprises: a metal substrate, an insulated resin layer on the metal substrate, a plurality of conductive paths on the insulating resin layer, the plurality of conductive paths providing connections to a plurality of semiconductor elements, means for detecting a current flowing in the semiconductor elements, the means for detecting including a resistance pattern on a resin film, the resistance pattern having at least one of a pair of bonding pads for current detection and of a pair of bonding pads for voltage detection, and means for connecting the at least one pair of the bonding pads to the conductive paths.

According to a further embodiment of the present invention, a hybrid integrated circuit device comprises: a metal substrate, an insulated resin layer on the metal substrate, a plurality of conductive paths on the insulating resin layer, a resistive means for detecting a current flowing in an external element, the resistive means including a resin film, a resistance pattern on the resin film, the resistance pattern having a first pair of bonding pads for current detection on one side of the resistance pattern and a second pair of bonding pads for voltage detection on another side of the resistance pattern, and means for connecting the first bonding pads to the conductive paths on the one side of the resistance pattern and for connecting the second bonding pads to the conductive paths on another side of the resistance pattern.

According to still another embodiment of the present invention, a hybrid integrated circuit device comprises: a metal substrate, an insulated resin layer on the metal substrate, a plurality of conductive paths on the insulating resin layer, the plurality of conductive paths providing connections to an external element, means for detecting a current flowing in the external element, the resistive means having a resin film, a resistance pattern on the resin film, the resistance pattern having a first pair of bonding pads for current detection on one side of the resistance pattern and a second pair of bonding pads for voltage detection on another side of the resistance pattern, and means for connecting the first bonding pads to the conductive paths on the one side of the resistance pattern and for connecting the second bonding pads to the conductive paths on a other side of the resistance pattern.

According to still another embodiment of the present invention, a hybrid integrated circuit device comprises: a metal substrate, an insulated resin layer on the metal substrate, a plurality of conductive paths on the insulating resin layer, the plurality of conductive paths providing connections to an external element, means for detecting a current flowing in the external element, the means for detecting including a resin film, a resistance pattern on the resin film, the resistance pattern having a pair of bonding pads for current detection on one side of the resistance pattern and at least first, second and third bonding pads for voltage detection on an other side of the resistance pattern, means for connecting the pair of bonding pads for current detection to the conductive paths, and means for connecting a selectable two of the at least first, second and third bonding pads for voltage detection to the conductive paths, whereby a selectable voltage signal is determined by the selectable two.

According to still another embodiment of the present invention, a hybrid integrated circuit device comprises: a metal substrate, an insulated resin layer on the metal substrate, a plurality of conductive paths on the insulating resin layer, the plurality of conductive paths providing connections to external elements, means for detecting a current flowing in the external elements, the means for detecting including a resin film, a resistance pattern on the resin film, the resistance pattern having a first pair of bonding pads for current detection on one side of the resistance pattern and a second pair of bonding pads for current detection on another side of the resistance pattern, and the resistive means having the foregoing components being, in a facedown condition, disposed on the plurality of conductive paths so that the first pair of bonding pads and the second pair of bonding pads connect directly to the plurality of conductive paths, and means for connecting the first and second pairs of bonding pads directly to the conductive path.

According to still another embodiment of the present invention, a resistance element for a hybrid integrated circuit comprises: a resin film, a resistance pattern on the resin film, and at least first and second spaced-apart bonding pads on the resistance pattern for connecting a current through the resistance pattern.

The above, and other objects, features and advantages of this invention will become apparent from the following description read in conjunction with the accompanying drawings, in which like reference numerals designate the same elements.

BRIEF DESCRIPTION OF THE DRAWINGS

FIG. 7 is an enlarged perspective view of a hybrid integrated circuit device according to a third embodiment of the present invention.

DETAILED DESCRIPTION OF THE PREFERRED EMBODIMENTS

Figure 1:
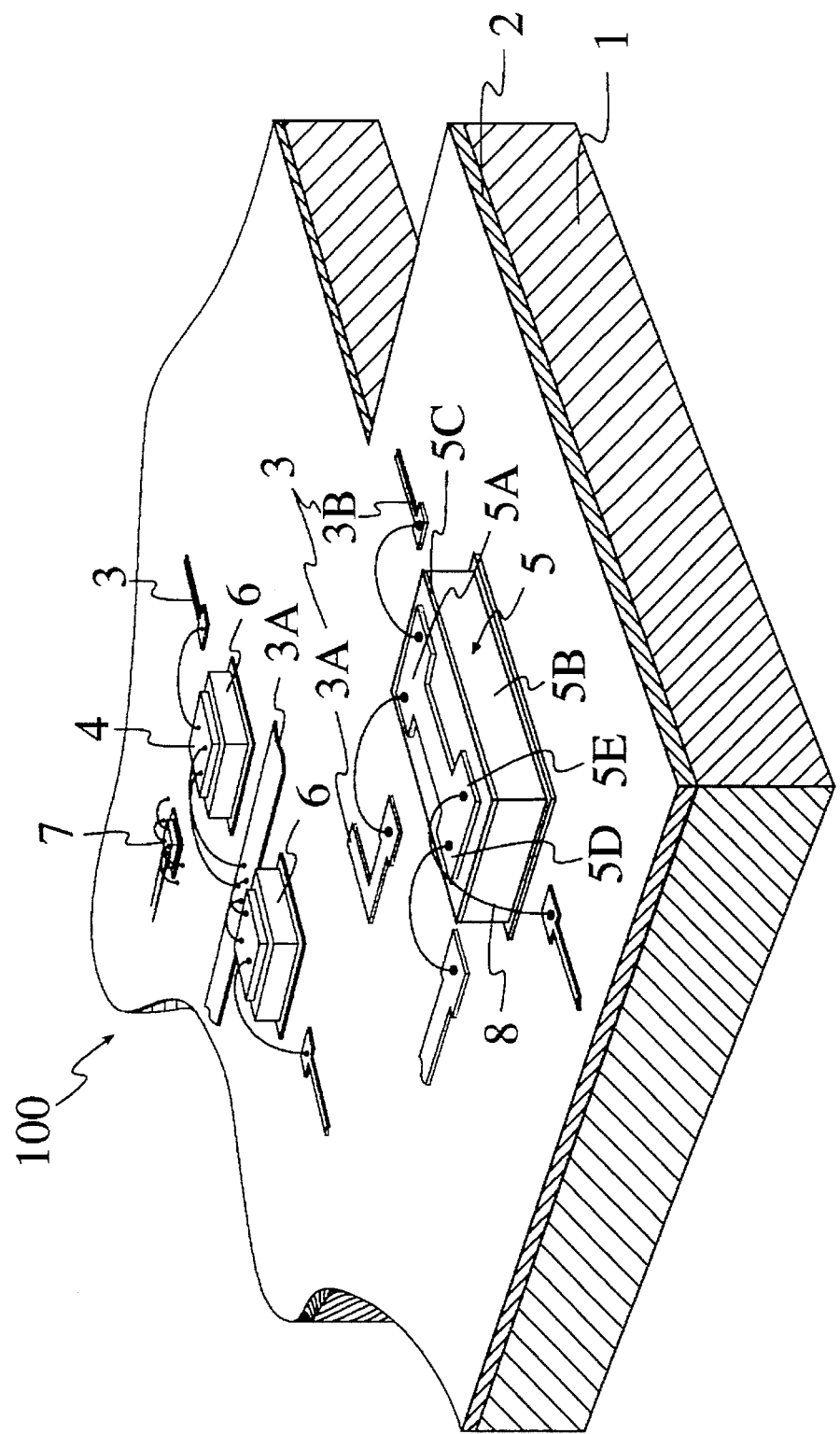
FIG. 1 is an enlarged perspective view of a hybrid integrated circuit device according to a first embodiment of the present invention.

Referring to FIG. 1, a hybrid integrated circuit device, shown generally at 100, includes a metal substrate 1 having an insulated resin layer 2 thereon. A plurality of heat sink members 6 are mounted on insulated resin layer 2. Each heat sink member 6 has a power semiconductor element 4 mounted thereon. A plurality of conductive paths 3A, 3B, etc., make up a conductive path 3 on insulated resin layer 2. Conductive path 3 provides connections to power semiconductor elements 4. A resistive body 5 for detecting a current flowing in semiconductor element 4 is affixed to insulated resin layer 2. Resistive body 5 is connected into a current path to one or more of semiconductor elements 4 by conductive path 3. In addition, a plurality of circuit elements 7 which constitute portions of an inverter circuit, to be described later, are disposed in the proximity of heat sink member 6.

Metal substrate 1 may be made of any suitable material, preferably a metal such as, for example, aluminum. Alternatively, metal substrate 1 may be made of copper. An oxide layer, $Al_2O_3$ is formed on metal substrate 1, on top of which is placed insulated resin layer 2. $Al_2O_3$ may be omitted. For simplicity of use, metal substrate 1 and insulated resin layer 2 may be obtained as a conventional clad material integrally formed with an epoxy resin or a polyimide resin and a copper foil layered on a main surface of metal substrate 1 by, for example, a hot press. The copper foil is formed into a suitable shape by coating with a resist, exposing the desired pattern in the resist, and etching the exposed or unexposed portions of the resist to make conductive path 3.

Figure 2:
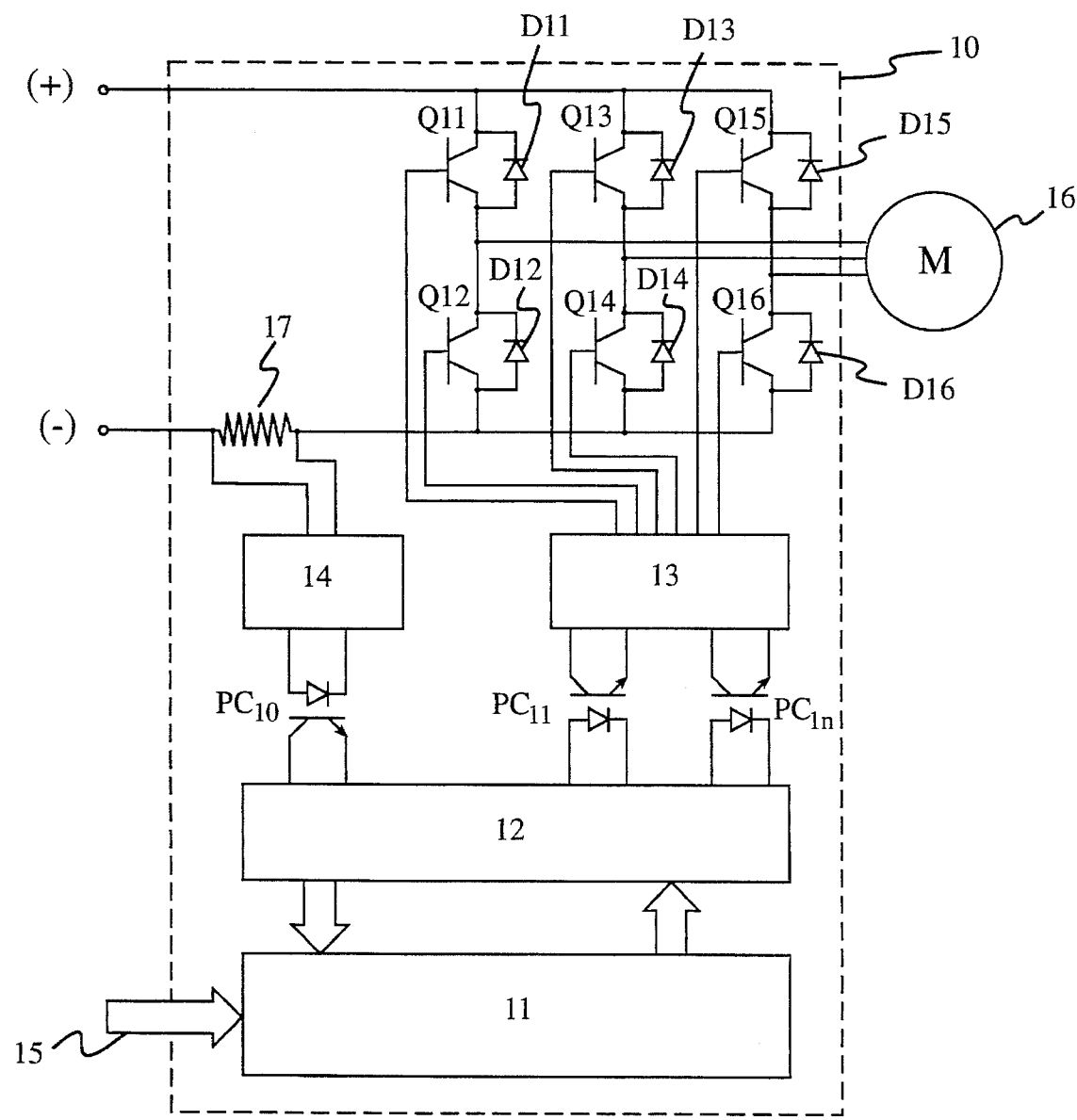
FIG. 2 is a schematic circuit diagram of an inverter as used in the present invention.
Figure 3:
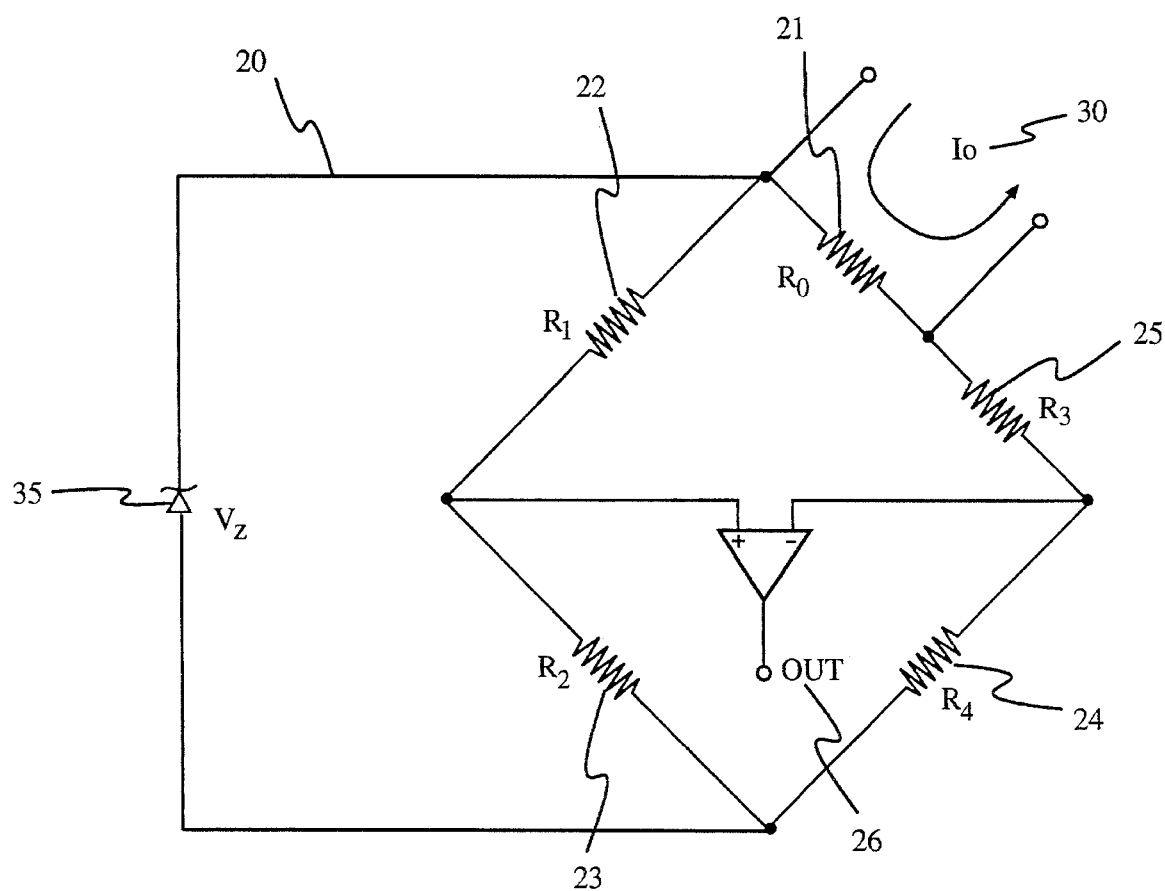
FIG. 3 is a bridge circuit for detecting a current according to the prior art.

Referring to FIG. 2, a typical circuit with which the present invention may be used is an inverter circuit 10 having a control circuit 11. Control circuit 11 generates an inverter control signal based upon an input Data $D_{in}$ 15. The information in Data $D_{in}$ 15 could be, for example, a commanded rotation velocity and direction of a motor M 16 which is illustrated as the load of inverter circuit 10.

Inverter circuit 10 includes a buffer 12 for outputting signal from control circuit 11 through optical couplers $PC_{10}$ to $PC_{1n}$ to a driver 13 and for inputting a signal from an overcurrent detecting circuit 14. Driver 13 then controls a plurality of switching elements $Q_{11}$ to $Q_{16}$. A plurality of regenerative diodes $D_{11}$ to $D_{16}$ are connected to the switching elements $Q_{11}$ to $Q_{16}$ to protect them from switching spikes during the on/off and off/on transitions. For example, when $Q_{12}$ is turned off, the current is regenerated through $D_{11}$. Finally, a current detecting resistor 17 is connected in series with the emitters of switching elements $Q_{11}$ to $Q_{16}$ and in parallel with overcurrent detecting circuit 14.

Although other types of circuits may be used, for purposes of description, control circuit 11 can be either a microcomputer or a Digital Signal Processor (DSP). It can, for example, generate a set of three pulse-width-modulated sine waves having a 120° phase difference and another set of three pulse-width-modulated sine waves which are 180° phase delayed relative to the first set of three pulse modulated sine waves. The frequency of the sine waves controls the rotation velocity of a motor M 16, and their phase sequence controls the direction of motor M 16, which is input as Data $D_{in}$ 15.

The three pulse width modulated sine waves are inputted to respective control electrodes of the switching elements $Q_{11}$ to $Q_{16}$ through buffer 12 and a plurality of photo couplers $PC_{10}$ to $PC_{1n}$ and driver 13, triggering either current sourcing or current sinking modes of operation.

Three pulse-width-modulated sine wave voltages are produced at a connecting point between switching elements $Q_{11}$ and $Q_{12}$, between switching elements $Q_{13}$ and $Q_{14}$ and between switching elements $Q_{15}$ and $Q_{16}$, respectively, to drive motor M 16. The load current flowing in motor M 16 approximates a sine wave.

If an overcurrent condition occurs, the overcurrent passing through detecting resistor 17 is sensed in overcurrent detecting circuit 14 which produces an overcurrent output signal for connection through optical coupler $PC_{10}$. The overcurrent output signal may be used in control circuit 11 to reduce or cut off the current supply to motor M 16. An overcurrent condition may result from motor M 16 being driven to consume excess current which could overload motor M, or by the switching elements being energized in series between the plus and minus supply busses. In accordance with the signals of overcurrent detecting circuit 14, control circuit 11 is able to carry out a protective operation such as a suspension of pulse output for a certain period. This operation is highly important in preventing damage to the semiconductor elements in inverter circuit 10.

Returning now to FIG. 1, resistive body 5 performs the very important function of detecting an overcurrent flowing in semiconductor element 4 in inverter circuit 10. More specifically, resistive body 5 is made of a metal. In the preferred embodiment resistive body 5 is made of copper. A resistance pattern 5A is formed on a polyamide resin film 5C on a surface of a copper element 5B. Copper element 5B has a thickness of about 0.5 to 2 mm and a length of about 10 to 15 mm. To prevent oxidation, the copper surface is plated with nickel. The thickness of the polyamide resin film 5C is about 5 to 15 µm to minimize its thermal resistance.

Resistance pattern 5A is preferably made of a very low TCR metal material in order to detect overcurrents accurately and stably, regardless of temperature changes. Preferably, the range of TCR is from 1 ppm to 500 ppm. For example, the following materials could be used: a copper/nickel alloy composed of 55% by weight of Cu and 45% by weight of Ni has a TCR of 15 ppm; a composition of 58% by weight of Cu and 42% by weight of Ni has a TCR of about zero; a copper/manganese alloy composed of 50 to 80% by weight of Cu and 12 to 30% by weight of Mn has a TCR of 1 ppm; a copper/nickel alloy composed of 50 to 80% by weight of Cu and 2 to 16% by weight of Ni has a TCR of 1 ppm; a nickel/chrome alloy also has a low TCR. In this embodiment, resistance pattern 5A is made of a copper/manganese alloy.

Resistance pattern 5A on metal element 5B may be trimmed to a suitable resistance value by etching its profile and thickness. For example, a resistance pattern 5A having a resistance value of about 1 m$\Omega$ to 50 m$\Omega$ may be formed on the surface of metal element 5B by producing a size of from about 5 to about 10 mm, by from about 0.5 to about 2 mm to, by from about 10 to about 15 mm.

The corners of resistance pattern 5A include two bonding pads 5D for current and another two bonding pads 5E for voltage detection. The level of voltage detection may be changed by positioning voltage detection bonding pads 5E away from the corners, and closer to centers of the edges of metal element 5B.

A plurality of conductive paths 3 are disposed in the proximity of resistive body 5. Bonding pad 5D for current and conductive path 3A are connected to each other by wire bonding with an aluminum wire 8 having a diameter of about 200 to 400 m. Bonding pad 5E for voltage detection and conductive path 3B for small signals are connected to each other by wire bonding with an aluminum wire 8 having a diameter of about 40 to 60 μm. To enhance the connection of aluminum wire 8, the surfaces of bonding pads 5D, 5E are plated with nickel.

Conductive path 3B is connected in series with a supply current to switching elements $Q_{11}$ to $Q_{16}$. When a predetermined voltage signal, resulting from an overcurrent condition, is applied to overcurrent detecting circuit 14 the resulting overcurrent signal triggers protective action to prevent destruction of switching elements $Q_{11}$ to $Q_{16}$.

The embodiment of FIG. 1 tends to concentrate the flow of current, and the resultant heat, along a central path. The concentration of heat may exceed the ability of resin film 5C.

Figure 5A:
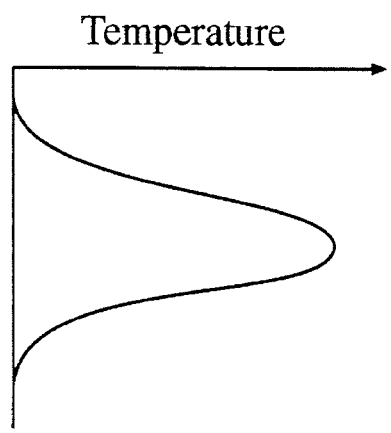
FIGS. 5A and 5B show a relationship between a current flow and its temperature distribution in accordance with the second embodiment.
Figure 5B:
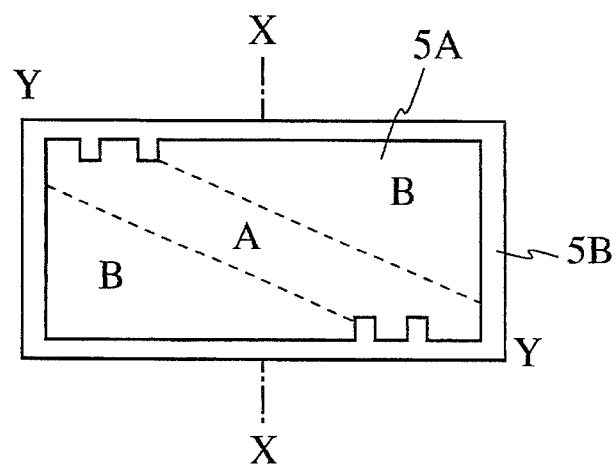

The problem caused by the concentration of current flow in the embodiment of FIG. 1 is shown in FIGS. 5A and 5B, to which reference is now made. The current tends to flow in a direct path along a diagonal line Y—Y between the terminals. The major part of the current flows in a diagonal central area A, with little or no current in a peripheral area B. Accordingly, for temperature distribution curve of the heat generated by the current, area A taken along the X—X line has a relatively high peak value as shown in FIG. 5A. As long as the highest temperature remains within the heatproof range of resin film 5C, no problem occurs. However, the high temperature produced in the central region by a large current may deteriorate resin film 5C and thereby may short circuit resistance pattern 5A and metal element 5B.

Figure 4:
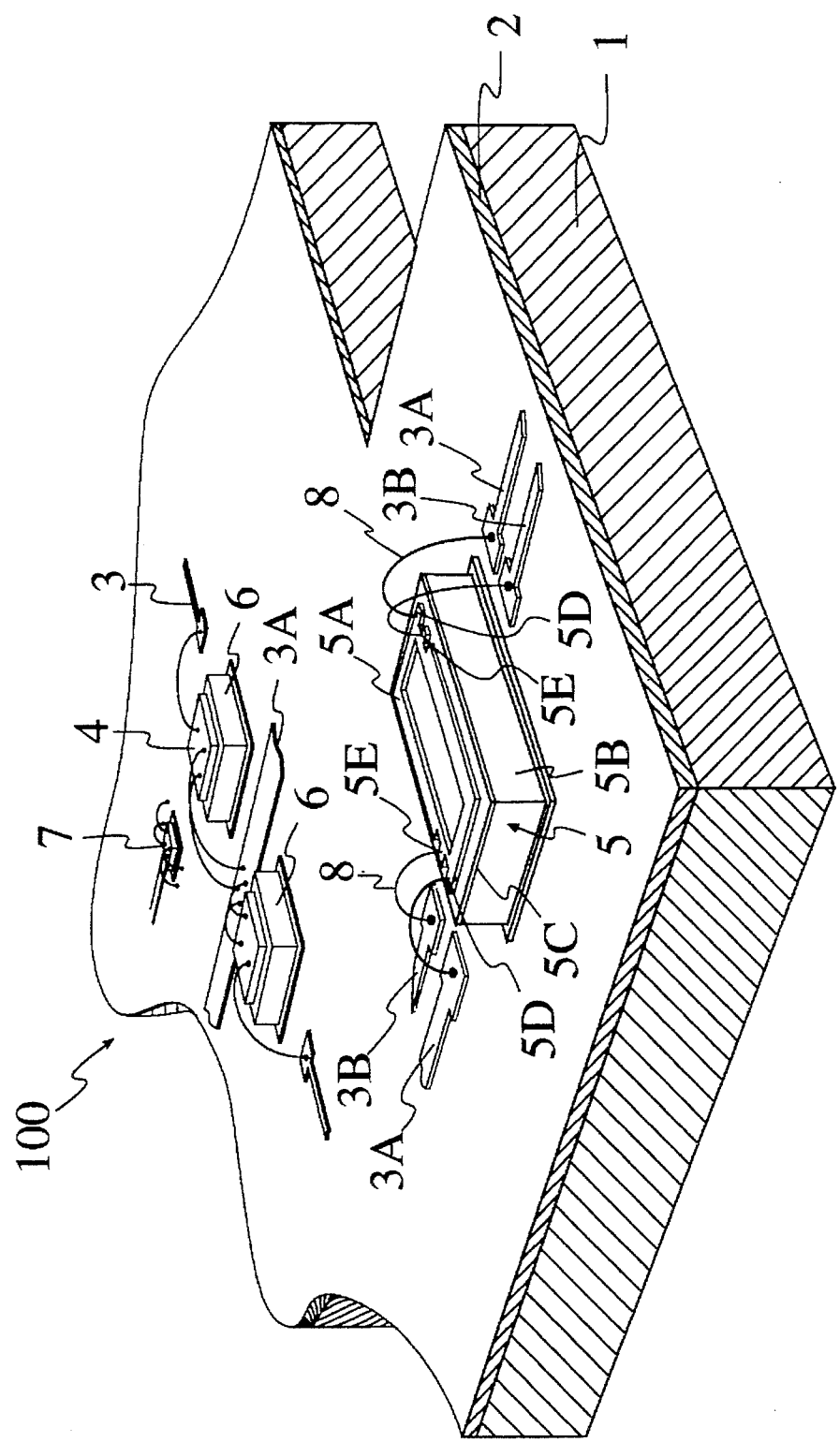
FIG. 4 is an enlarged perspective view of a hybrid integrated circuit device according to a second embodiment of the present invention.
Figure 6A:
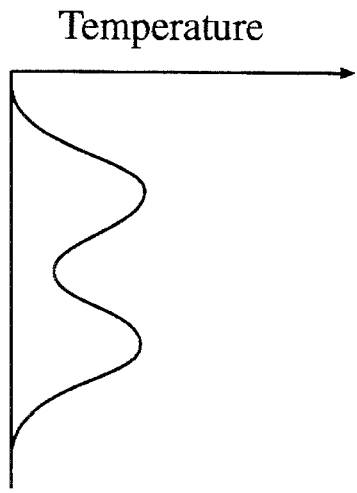
FIGS. 6A and 6B show another relationship between a current flow and its temperature distribution in accordance with the second embodiment.
Figure 6B:
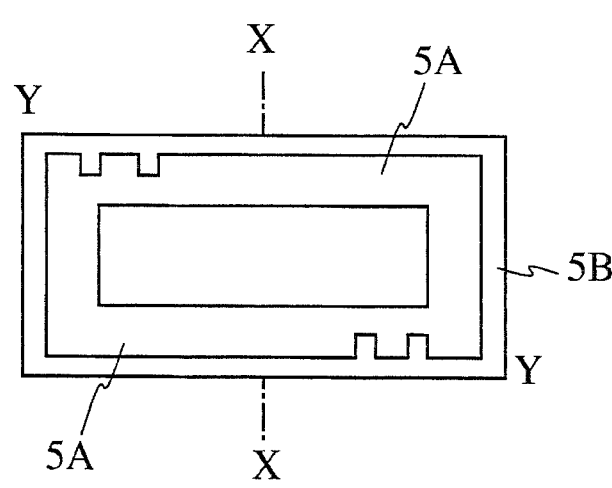

A second embodiment of this invention will now be discussed with reference to FIGS. 4 to 6A, 6B. Referring to FIG. 4, a different shape of resistance pattern 5A on an overall surface of a resistance metal element 5B for current detection overcomes the problem of the concentration of current and heat in a central region of resistance pattern 5A. To avoid a concentration of current in a diagonal line, a central part of resistance pattern 5A in FIG. 4 is removed to split the current flow along two separate routes about its perimeter. The temperature cross section of resistance pattern 5A is shown in FIGS. 6A and 6B. The maximum value of the double peak of the temperature cross section is lower than is the case with the embodiment of FIG. 1.

Referring to FIG. 4, the second embodiment has a resistance pattern 5A such that the current flows along two paths. As can be seen from FIGS. 6A and 6B, the heat generated by the current is more evenly distributed on the surface of the resistance pattern 5A. This greatly reduces the problem of concentration of current and heat in a central region as discussed above. In this embodiment the bonding pads 5D and 5E are placed in only two corners of resistance pattern 5A. The two bonding pads 5D and 5E are slightly spaced apart from each other. Each bonding pad is connected to respective conductive paths 3A and 3B by wire 8.

A third embodiment of this invention will now be discussed with reference to FIGS. 7 to 10A, 10B, 10C. Referring to FIG. 7, a first pair of bonding pads 5D for current detection and a second pair of bonding pads 5E for voltage detection are disposed on four corners of resistance pattern 5A. The first pair of bonding current detection pads 5D on one side of shaped resistance 5A are connected by wires 8A to respective conductive paths 3A. The second pair of bonding pads 5E on the second side of shaped resistance 5A are connected to respective conductive paths 3B by wires 8B. That is, first wires 8A and second wires 8B are connected to opposite sides of shaped resistance 5A. The current through wires 8A preferably flows in shaped resistance 5A in a direction opposite to the current through wires 8B.

Figure 8:
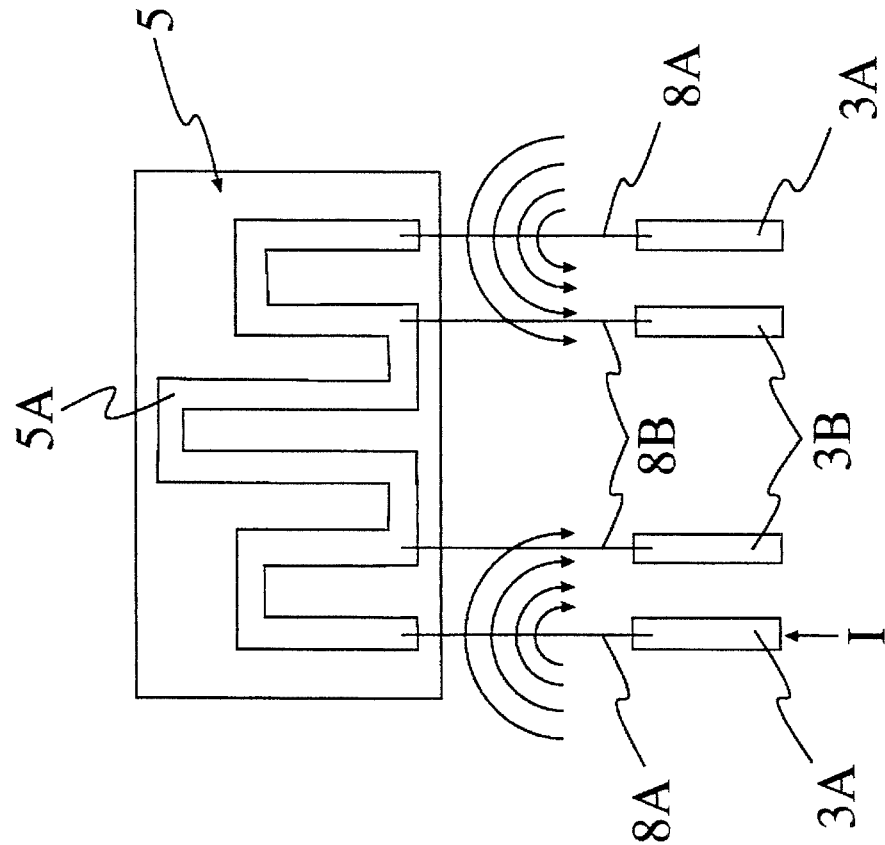
FIG. 8 is a schematic diagram showing the effects of mutual inductance in the embodiment of FIG. 7.

FIG. 8 shows an example of the consequences when the wires 8A and the wires 8B are disposed in the same direction on the same side of resistance metal body 5. The current flows in a loop made up of wire 8A, resistance pattern 5A and wire 8A. This results in lines of magnetic force being induced in the direction indicated in FIG. 8. Due to the mutual inductance caused in wire 8B, noise is created in the circuit, making it impossible to detect the current accurately. More particularly, noise is frequently generated by turning on or off switching elements $Q_{11}$ to $Q_{16}$.

Figure 9:
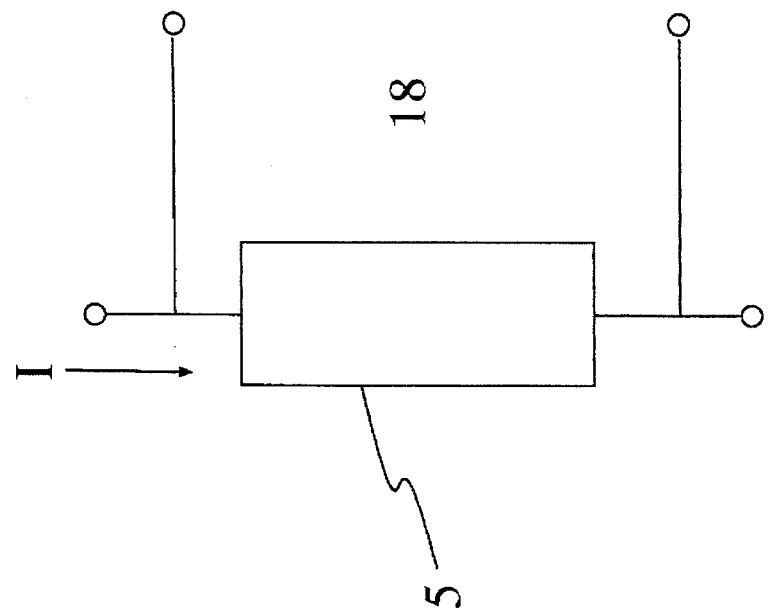
FIG. 9 is a schematic view showing a current flow in the embodiment of FIG. 7.
Figure 10A:
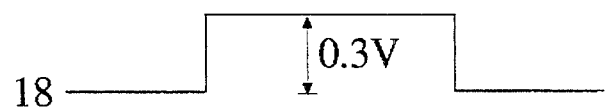
FIG. 10A is an ideal voltage waveform in the embodiment of FIG. 7.
Figure 10B:
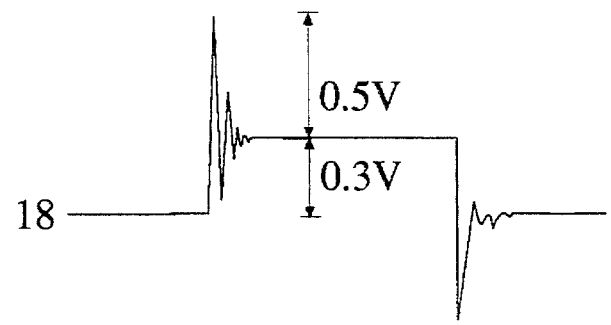
FIG. 10B is another voltage waveform in the embodiment of FIG. 7.
Figure 10C:
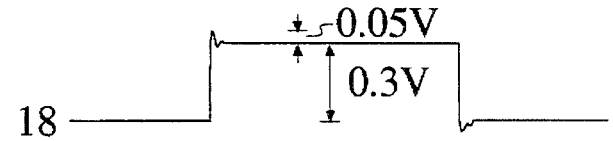
FIG. 10C is a further voltage waveform in the embodiment of FIG. 7.

The embodiment shown in FIG. 7 eliminates the above problem. FIGS. 9, 10A, 10B and 10C show the comparative differences between the above two wiring schemes. FIG. 9 shows a test example, in which 100 A current was supplied to resistive body 5 having a resistance value of 3 mΩ. A voltage $V_0$ 18 was then measured during turning on and off the foregoing switching elements. FIG. 10A shows an ideal voltage waveform of $V_0$ containing no noise. FIG. 10B shows a voltage waveform where wires 8A and 8B are disposed in the same direction. Here about 0.5 V of noise occurred when turning on and off the switching elements. FIG. 10C shows a voltage waveform where wires 8A and 8B are disposed in opposite directions. In this instance, only 0.05 V of noise was observed. The latter waveform allows for better accuracy since it more closely resembles the ideal waveform. It is apparent that less noise occurred in FIG. 10C because wire 8B was not affected by mutual inductance. As a result, it is possible to detect overcurrent accurately in the case of FIG. 10C. To further minimize mutual inductance, bonding pads 5D and 5E are closely spaced from their respective conductive paths 3A and 3B.

Figure 11:
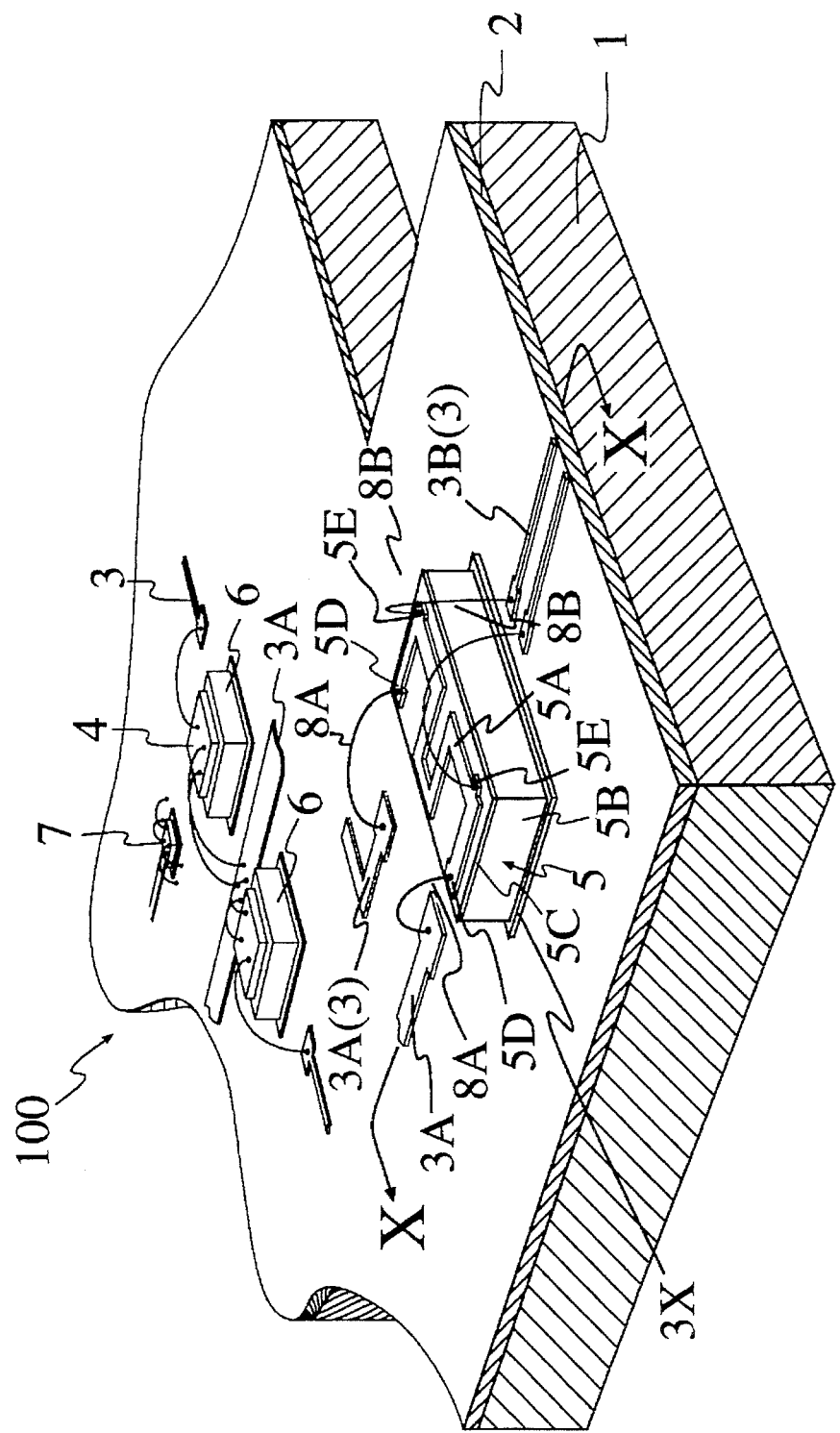
FIG. 11 is an enlarged perspective view of a hybrid integrated circuit device according to a fourth embodiment of the present invention.
Figure 12:
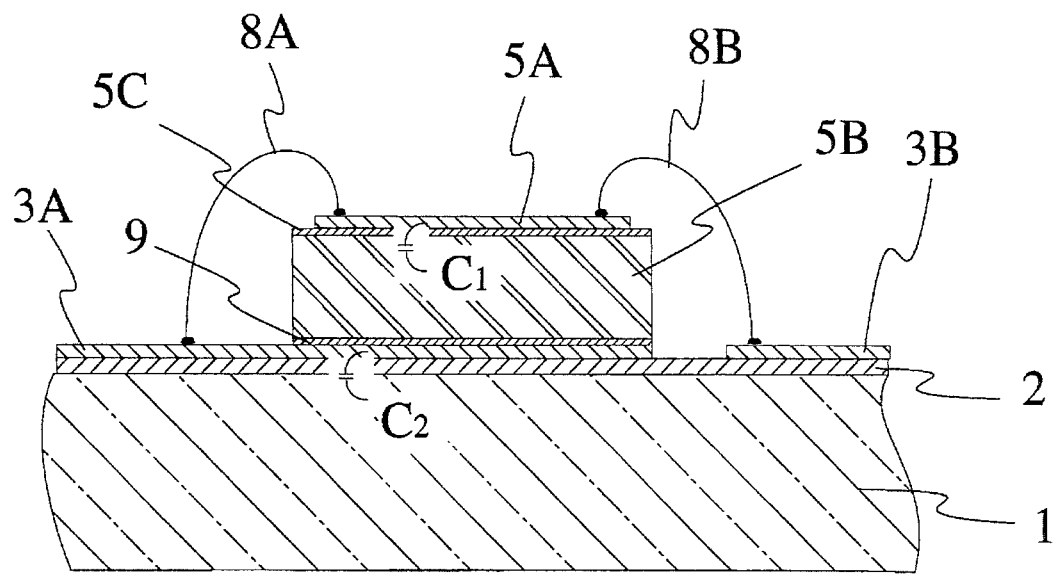
FIG. 12 is a partially cutaway section view of the embodiment of FIG. 11.

A fourth embodiment of this invention will now be discussed with reference to FIGS. 11 to 13. A main feature of the fourth embodiment is that resistive body 5 is fixed directly on at least one conductive path 3A. More specifically, a bottom pad 3X of resistive body 5 is affixed by solder 9 on conductive path 3A. A plurality of wires 8A and 8B are connected to the remaining bonding pads in the same way as previously shown in the third embodiment.

The reason why resistive body 5 is fixed on conductive path 3A is that parasitic capacitances C1 and C2 occur on resistive body 5 and substrate 1. As shown in FIG. 12, parasitic capacitance C1 is a result of the layered structure of resistance pattern 5A, resin film 5C and metal body 5B. Parasitic capacitance C2 is a result of the layered structure of substrate 1, resin layer 2 and conductive path 3A.

Figure 13:
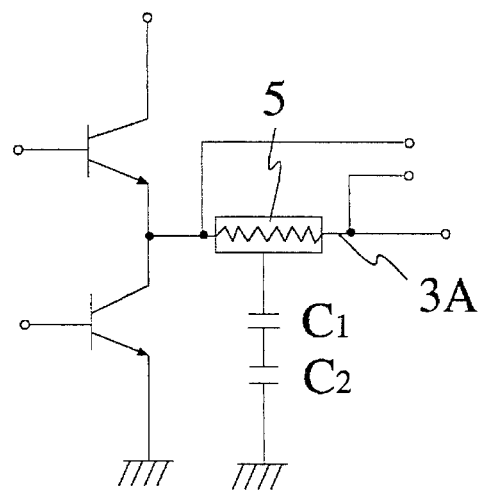
FIG. 13 is a schematic circuit for detecting a current in the embodiment of FIG. 11.

FIG. 13 shows a schematic circuit, in which resistive body 5 is fixed on a separate island-shaped conductive path 3A. In this circuit, the current flowing in two switching elements $Q_1$ and $Q_2$ are detected. The two parasitic capacitances C1 and C2 are formed as shown in FIG. 13. A voltage occurs during charging of parasitic capacitances C1 and C2. This voltage, in turn, may destroy resin film 5C of resistive body 5.

Specifically, resin film 5C is made as thin as possible for efficient conduction of the heat generated on resistance pattern 5A to metal body 5B. Accordingly, the withstand voltage of resin film 5C is small. More specifically, if the thickness of resin film 5C is 5 to 15 μm, then its withstand voltage is about 60 to 100 V. If the thickness of resin film is 28 μm, then its withstand voltage is about 600 V. In the circuit shown in FIG. 13, if the parasitic capacitances $C_1$ and $C_2$ are 100 PF, then 150 V will occur in parasitic capacitances $C_1$ and $C_2$. Since the withstand voltage of resin film 5C is 60 to 100 V, resin film 5C will be destroyed.

This result may be avoided solved by increasing the thickness of resin film 5C. However, increasing the thickness of resin film 5C also increases its thermal resistance and decreases its thermal conductivity. This causes the resistance value of pattern 5A to be variable and makes it impossible to detect the current accurately. From this point of view, the thickness of resin film 5C must be made as thin as possible.

Accordingly, this embodiment eliminates the problem by placing the conductive path 3A immediately on bottom pad 3X of metal body 5B. In this configuration, parasitic capacitance C2 is charged, but parasitic capacitance C1 is rarely charged. Accordingly, no voltage occurs in resin film 5C. Although a voltage occurs in resin layer 2, that layer has a sufficient withstand voltage to avoid destruction.

Figure 14:
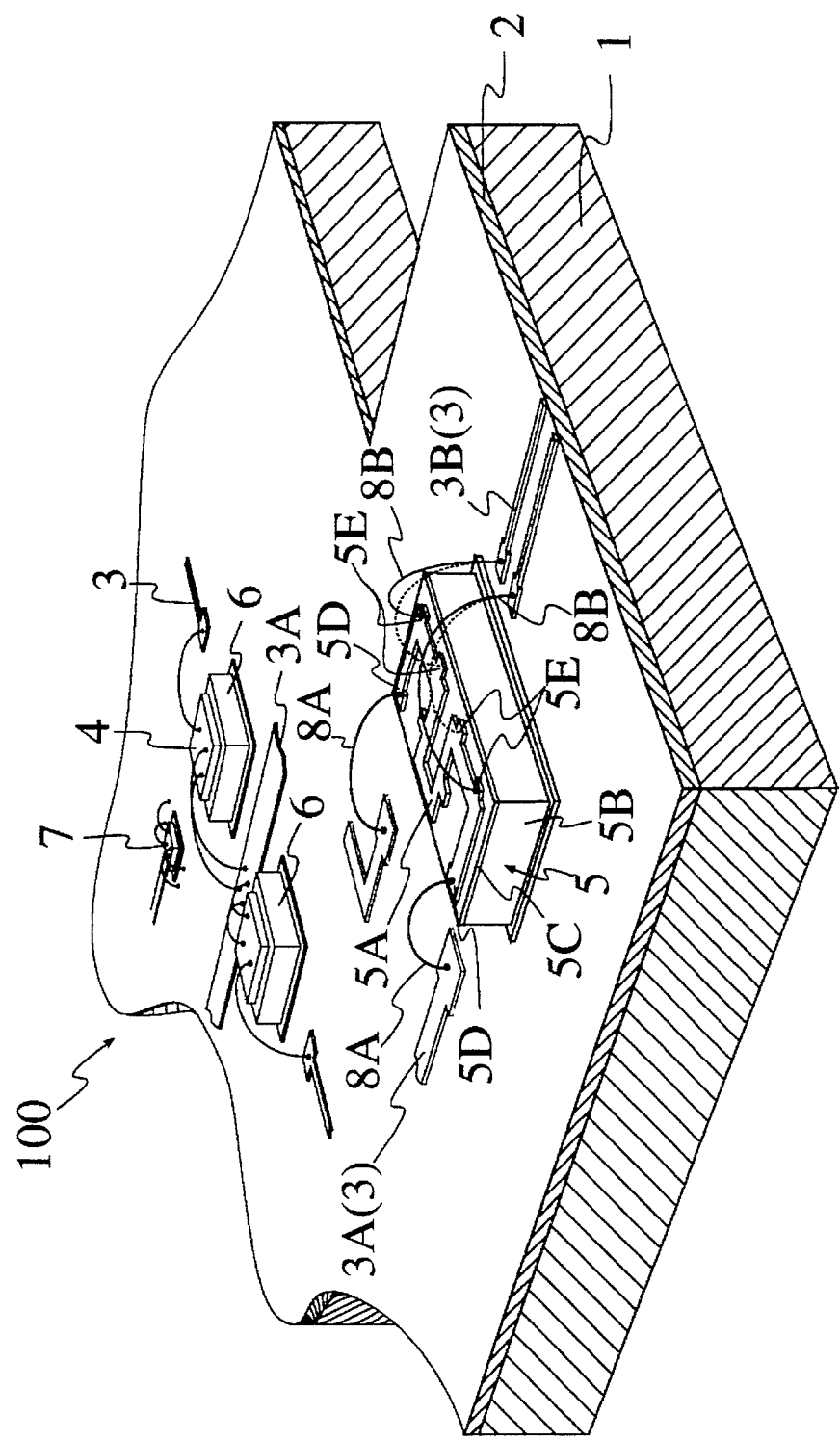
FIG. 14 is an enlarged perspective view of a hybrid integrated circuit device according to a fifth embodiment of the present invention.

A fifth embodiment of this invention will be discussed with reference to FIG. 14. In order to have multiple resistance values on one resistance pattern 5A, a number of bonding pads 5E for voltage detection are formed on resistance pattern 5A. The bonding pads are spatially separated. As a result, resistive body 5 can provide a number of different resistance values selectable by choosing which bonding pads 5E to connect.

This structure provides the ability to adjust the resistance value by changing the bonding position of the bonding pads 5E. This may be needed when an error occurs in the detecting circuit. For example, assume a trigger current of 10 A is desired and that the selected bonding pad 5E for voltage detection has a 10 m$\Omega$ resistance value connected to conductive path 3. Therefore, the signal to be detected will be 0.1 V. Now assume that the voltage detected is 0.11 V due to minor errors inherent in the detecting circuit. In that case, by connecting to a different bonding pad 5E on resistance pattern 5A, the resistance value may be changed from 10 m$\Omega$ to 11 m$\Omega$ so as to permit accurate detection of a 10 A current. According to this embodiment, since a single resistive body 5 has a plurality of different resistance values on a single resistance pattern 5A, it is possible to compensate for errors in the system using a single resistive body 5.

Figure 15:
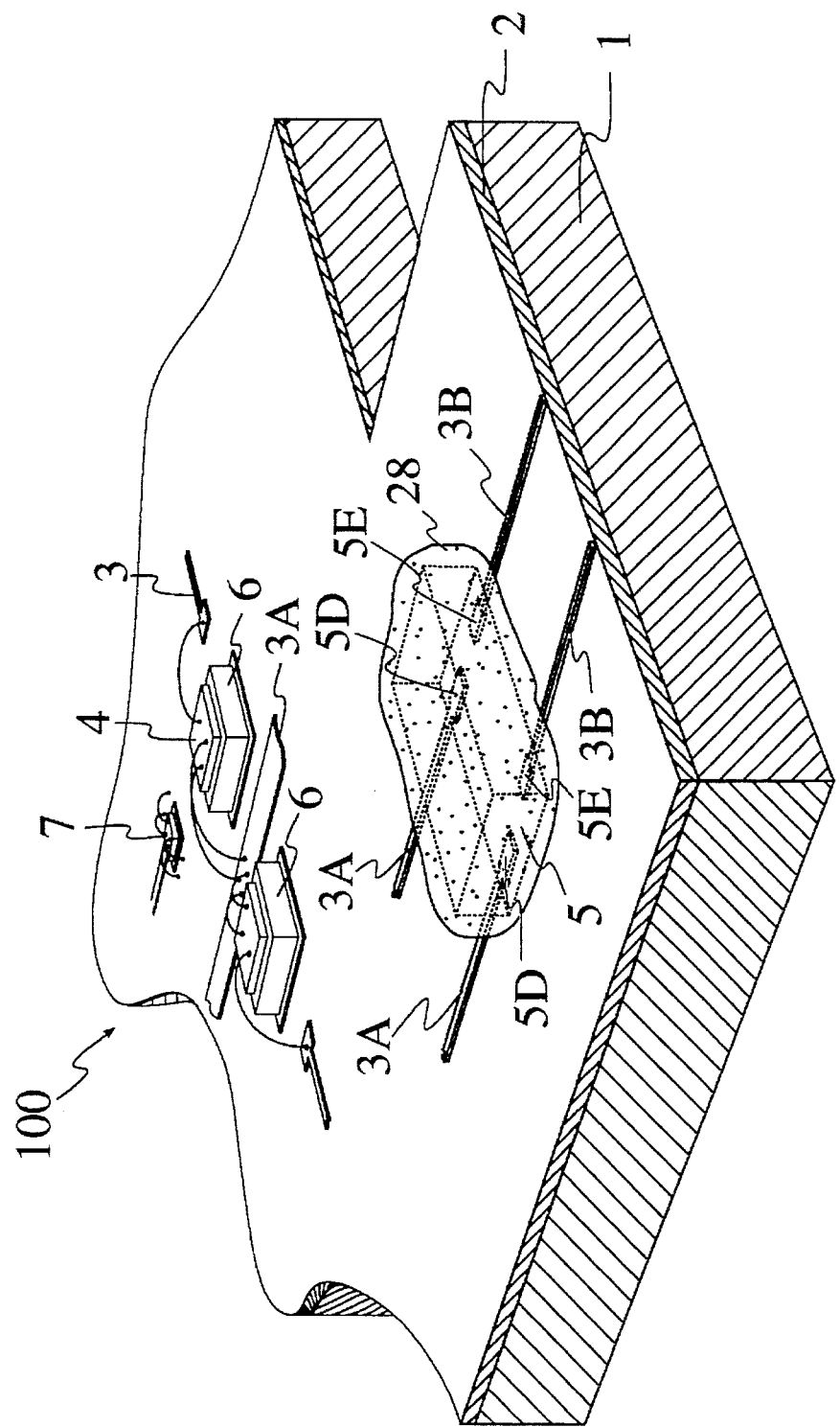
FIG. 15 is an enlarged perspective view of a hybrid integrated circuit device according to a sixth embodiment of the present invention.

A sixth embodiment of this invention will be described with reference to FIG. 15. A main feature of the sixth embodiment is that resistive body 5 is connected facedown to conductive paths 3A and 3B. Like the third embodiment, a pair of bonding pads 5D for current detection and another pair of bonding pads 5E for voltage detection are formed, and fixed by solder, on four corners of resistance pattern 5A of resistive body 5. Since resistive body 5 is facedown, a pair of bonding pads 5D for current detection are mounted directly on, and soldered to, a pair of conductive paths 3A. A pair of bonding pads 5E for voltage detection are mounted directly on, and soldered to, a pair of conductive paths 3B.

A disadvantage of the facedown configuration is that it may be difficult to efficiently dissipate the heat generated when current is supplied to resistive body 5. If the heat is not dissipated, the heat causes the resistance value of resistance pattern 5A to be variable and this results in inaccurate detection. This inaccuracy results even though the resistance pattern 5A is made of an alloy material having a very low TCR, approximately 1 ppm to 500 ppm.

This disadvantage may be resolved by coating the facedown resistive body 5 with an insulating resin 28 having good thermal conductivity properties, which efficiently discharge the heat generated by the current. Preferably, insulating resin 28 is comprised of an epoxy resin, which contains about 57% by weight of an inorganic filler having good thermal conductivity.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A hybrid integrated circuit device comprising:

a metal substrate;

an insulating resin layer on said metal substrate;

a plurality of conductive paths and a plurality of bottom pads on said insulating resin layer;

said plurality of conductive paths providing connections to a plurality of semiconductor elements affixed to said bottom pads;

means for detecting a current flowing in said semiconductor elements;

said means for detecting including a resistance pattern on a resin film;

said resin film being affixed to said bottom pads;

said resistance pattern having at least a first pair of bonding pads for detecting current and at least a second pair of bonding pads for detecting voltage; and means for connecting at least one of said at least a first and second pairs to said plurality of conductive paths.

2. A hybrid integrated circuit device as in claim 1, wherein:

said means for connecting includes an aluminum wire having a diameter of about 200 to 400 µm connecting to said at least a first pair of bonding pads and an aluminum wire having a diameter of about 40 to 60 mµ for connecting to said at least a second pair of bonding pads.

3. A hybrid integrated circuit device as in claim 1, wherein said resistance pattern is made of an alloy material which has a temperature coefficient of resistance of from about 1 ppm to about 500 ppm in dimensionless units.

4. A hybrid integrated circuit device as recited in claim 3, wherein said alloy material is composed of 50%–80% by weight of copper and 12%–30% by weight of manganese.

5. A hybrid integrated circuit device as recited in claim 3, wherein said alloy material is composed of 50%–80% by weight of copper and 2%–16% by weight of nickel.

6. A hybrid integrated circuit device as in claim 1, wherein:

said at least a first pair of bonding pads is on one side of said resistance pattern and said at least a second pair of bonding pads for voltage detection is on another side of said resistance pattern;

said means for connecting connects each of said bonding pads to each of said conductive paths;

said means for connecting is a wire; and said resistance pattern provides a dual path for current flow.

7. A hybrid integrated circuit device comprising:

a metal substrate;

an insulating resin layer on said metal substrate;

a plurality of conductive paths and a plurality of bottom pads on said insulating resin layer;

a resistor for detecting a current flowing in an external element;

said resistor including a resin film;

said resin film being affixed to said bottom pads;

a resistance pattern on said resin film;

said resistance pattern having on one side of said resistance pattern a first pair of bonding pads for detecting current and on another side of said resistance pattern a second pair of bonding pads for detecting voltage; and means for connecting said first pair of bonding pads to said conductive paths on said one side of said resistance pattern and for connecting said second pair of bonding pads to said conductive paths on said another side of said resistance pattern.

8. A hybrid integrated circuit device comprising:

a metal substrate;

an insulating resin layer on said metal substrate;

a plurality of conductive paths and a plurality of bottom pads on said insulating resin layer;

said plurality of conductive paths providing connections to an external element;

means for detecting a current flowing in said external element;

a resistor having a resin film;

said resin film being affixed to said bottom pads;

a resistance pattern on said resin film;

said resistance pattern having on one side of said resistance pattern a first pair of bonding pads for detecting current and on another side of said resistance pattern a second pair of bonding pads for detecting voltage; and means for connecting said first pair of bonding pads to said conductive paths on said one side of said resistance pattern and for connecting said second pair of bonding pads to said conductive paths on said another side of said resistance pattern.

9. A hybrid integrated circuit device as recited in claim 8, wherein said resistive means further comprises:

a bottom pad of said resistance pattern;

said bottom pad being mounted directly on said conductive path corresponding to said first pair of bonding pads;

said means for connecting being a solder connection.

10. A hybrid integrated circuit device comprising:

a metal substrate;

an insulating resin layer on said metal substrate;

a plurality of conductive paths and a plurality of bottom pads on said insulating resin layer;

said plurality of conductive paths providing connections to an external element;

means for detecting a current flowing in said external element;

said means for detecting including a resin film;

said resin film being affixed to said bottom pads;

a resistance pattern on said resin film;

said resistance pattern having on one side of said resistance pattern a pair of bonding pads for detecting current and on another side of said resistance pattern at least first, second and third bonding pads for detecting voltage;

means for connecting said pair of bonding pads to said conductive paths; and means for connecting a selectable two of said at least first, second and third bonding pads to said conductive paths, whereby a selectable voltage signal is determined by said selectable two.

11. A hybrid integrated circuit device comprising:

a metal substrate;

an insulating resin layer on said metal substrate;

a plurality of conductive paths and a plurality of bottom pads on said insulating resin layer;

said plurality of conductive paths providing connections to external elements;

means for detecting a current flowing in said external elements;

said means for detecting including a resin film;

said resin film being affixed to said bottom pads;

a resistance pattern on said resin film;

said resistance pattern having on one side of said resistance pattern a first pair of bonding pads for detecting current and on another side of said resistance pattern a second pair of bonding pads for detecting current; and said resistance pattern having the foregoing components being, in a facedown condition, disposed on said plurality of conductive paths so that said first pair of bonding pads and said second pair of bonding pads can connect directly to said plurality of conductive paths; and means for connecting said first and second pairs of bonding pads directly to said plurality of conductive paths.

12. A hybrid integrated circuit device as recited in claim 11, wherein:

said resistive means includes an electrically insulating resin between said resistance pattern and said substrate; and said electrically insulating resin being of a type providing substantial thermal conductivity, whereby heat generated in said resistance pattern is conducted to said substrate.

13. A hybrid integrated circuit device as recited in claim 12, wherein said insulating resin is an epoxy resin composed of about 57% by weight of an inorganic filler having a good thermal conductivity.

14. A resistance element for a hybrid integrated circuit comprising:

a resin film;

a resistance pattern on said resin film;

at least a first and second spaced-apart bonding pads on said resistance pattern for connecting a current through said resistance pattern;

means for distributing a current flow over said resistance pattern including an opening in a central region of said resistance pattern effective to force current to flow about a perimeter of said resistance pattern; and means for connecting current to said at least a first and second spaced-apart bonding pads, wherein said means for connecting includes means for minimizing magnetic interference with an output of said resistance pattern.

15. A resistance element according to claim 14, further comprising means for distributing a current flow over said resistance pattern.

16. A resistance element according to claim 15, wherein:

said resistance pattern is generally rectangular.

17. A resistance element according to claim 14, wherein said means for minimizing magnetic interference includes means for connecting a voltage signal for flow in a first direction and means for connecting a current signal for flow in a second direction.

18. A resistance element according to claim 14, wherein:

said resistance pattern is a serpentine pattern; and said at least first and second spaced-apart bonding pads includes first and second pairs of bonding pads;

said first pair of bonding pads being disposed at ends of said serpentine pattern, on a first side thereof; and said second pair of bonding pads being disposed at intermediate positions on said serpentine pattern, on a second side thereof.

\* \* \* \* \*